United States Patent [19]

Wiegand

[11] 4,247,601
[45] Jan. 27, 1981

[54] SWITCHABLE MAGNETIC DEVICE

[75] Inventor: John R. Wiegand, Valley Stream, N.Y.

[73] Assignee: The Echlin Manufacturing Company, Branford, Conn.

[21] Appl. No.: 897,483

[22] Filed: Apr. 18, 1978

Related U.S. Application Data

[63] Continuation-in-part of Ser. No. 793,394, May 3, 1977, abandoned.

[51] Int. Cl.³ .............................................. H01F 1/04
[52] U.S. Cl. .................................. 428/611; 148/121; 365/133; 428/928
[58] Field of Search ....................... 148/121, 31, 31.5; 428/614, 611, 928; 365/133

[56] References Cited

U.S. PATENT DOCUMENTS

| | | | |
|---|---|---|---|
| 1,862,559 | 6/1932 | White et al. | 75/170 |
| 2,190,667 | 2/1940 | Kelsall et al. | 75/170 |
| 3,138,494 | 6/1964 | Burket et al. | 148/103 |
| 3,148,092 | 9/1964 | Shull, Jr. | 148/103 |
| 3,390,443 | 7/1968 | Gould et al. | 148/31.55 |
| 3,422,407 | 1/1969 | Gould et al. | 365/133 |
| 3,780,313 | 12/1973 | Wiegand | 365/62 |
| 3,820,090 | 6/1974 | Wiegand | 340/174 ZB |
| 3,892,118 | 7/1975 | Wiegand | 148/101 |

FOREIGN PATENT DOCUMENTS 47-26220  7/1972  Japan ..................... 428/928

OTHER PUBLICATIONS

Bozorth, R; *Ferromagnetism*, New York, 1951, pp. 200–205.

*Primary Examiner*—L. Dewayne Rutledge
*Assistant Examiner*—Michael L. Lewis
*Attorney, Agent, or Firm*—McAulay, Fields, Fisher, Goldstein & Nissen

[57] ABSTRACT

The magnetic switching device which employs what has come to be known as the Wiegand Effect is described in U.S. Pat. No. 3,820,090. What is disclosed herein is an improved switching device made from an alloy of iron, cobalt and vanadium that provides a greater switching effect. An improved or optimized torsional strain routine for fabricating the wire switching device is also disclosed. The improved switching device provides its maximum output pulse when the wire is switched in an asymmetric fashion.

19 Claims, 5 Drawing Figures

SWITCHABLE MAGNETIC DEVICE

RELATED APPLICATIONS

This is a continuation-in-part of my pending application Ser. No. 793,394 filed May 3, 1977 having the above title now aband.

BACKGROUND OF THE INVENTION

The magnetic device described in my U.S. Pat. No. 3,820,090 issued June 24, 1974 is a ferro-magnetic wire having core and shell protions with divergent magnetic properties. As taught in my U.S. Pat. No. 3,892,118 issued July 1, 1975 this device is made by applying a cycling torsional strain to the wire so as to circumferentially strain the wire. The wire is torsionally strained in alternate clockwise and counterclockwise directions while maintaining axial tension on the wire. The result is a wire which, it is believed, because it has a relatively harder magnetic shell and a relatively softer magnetic core, has the property that, once magnetized, the magnetically harder shell can capture the magnetically softer core.

When the wire is magnetized and then subjected to an increasing external magnetic field that is parallel to the axis of the wire, a threshold is reached where the external field suddenly captures the core thus rapidly reversing the magnetization of the core. A pick-up coil around the wire will produce a pulse in response to the rapid change in the direction of flux in the core. The reversal of core magnetization occurs in response to the external magnetic field intensity exceeding a threshold and is substantially rate insensitive. That is, the magnitude of the output pulse is only slightly dependent on the rate-of-change of applied field as it passes through the threshold value. This is to be contrasted with more conventional pulse generating circuits based on soft magnetic materials whose hysteresis loops are continuous. The output-pulse amplitude (and the inverse of the pulse width) of this latter class of devices is essentially proportional to the time-rate-of-change of the field as it passes through the coercive force.

Similarly, there is a reverse switch in core magnetization and a reverse pulse generated in the pick-up coil as the external magnetic field decreases past a second threshold. Again, the pulse output is substantially independent of the rate at which the magnetic field decreases; all that is required is that the switching threshold is passed.

The magnitude of the output pulse is of critical importance in determining the value of the wire and in determining the scope of applications to which the wire can be commercially put. The larger the pulse, the less will be required in the way of electronic circuitry associated with the pick-up coil to distinguish the pulse from background noise. The larger the pulse amplitude, the more repeatable will be any output condition that is to be initiated or recorded by the incidence of the pulse.

Accordingly, it is a major purpose of this invention to provide an improved switching device of the type described in the above patents that responds to a threshold external magnetic field to produce a pulse having improved signal to noise ratio and a larger peak amplitude.

It is a related and further important purpose of this invention to provide such an improved wire as will provide the kind of switching response to the threshold magnetic field that will produce a uniform and repeatable output pulse from a pickup coil.

The above mentioned patents describe a magnetic device having two magnetic states, a reverse state in which core and shell have opposite directions of magnetization and a confluent state in which core and shell have the same direction of magnetization.

In brief, the wire disclosed in U.S. Pat. No. 3,820,090 is made from a commercially available wire, having in one embodiment a 0.25 mm diameter and an alloy composition that is 48 percent iron and 52 percent nickel.

In brief, the method of manufacturing disclosed in U.S. Pat. No. 3,892,118 for the wire switching device comprises the use of a fine grain nickel-iron alloy having for example, a 0.25 mm diameter. A one meter length of this wire is elongated four centimeters. The elongated wire is held under tension between two chucks and cycled counterclockwise and clockwise at a rate of 0.4 turns per centimeter of wire. Thus for the one meter length of wire, the chucks rotate 40 complete revolutions in one direction and then 40 complete revolutions in the other direction. This clockwise and counterclockwise rotation is repeated ten to fifteen times. The chucks are supported in a machine which maintains a constant tension of 450 grams as the rotation occurs. After this processing, the tension is removed and the one meter length of wire is cut into whatever lengths are desired (usually about one to three cm each) for use in the various switching and pulse generating applications which have been developed for this wire.

Some variation in tension, number of turns per meter and number of cycles of clockwise and counterclockwise rotation are desirable as a function of wire diameter, wire chemistry and application in which the wire is to be used.

BRIEF DESCRIPTION

In brief, it has been found that a preferred chemical composition for preparing a wire exhibiting these switching characteristics is a wire composed of an alloy of iron and cobalt and vanadium. In one embodiment, the wire is 52 percent cobalt, 10 percent vanadium and the balance iron. The vanadium appears to enhance coercivity without decreasing the ductility required for cold working.

Further, a preferred mode of manufacture for working the cobalt-iron-vanadium wire has been found that produces wire having a fast switching effect and thus provides, in a pick-up coil, a large output pulse that is repeatable and uniform. A wire approximately one quarter millimeter (0.010 inches) in diameter and about 30 centimeters (12 inches) in length is subjected to sufficient tension to straighten it out but without stretching the wire. Thereafter, the wire is subjected to torsional straining combined with elongation. The torsional straining is in alternate clockwise and counterclockwise directions and provides the necessary work hardening for the wire. The torsional straining schedule is asymmetrical; that is, the number of turns given in each direction is not the same. At the end of the cold working routine the wire is given an ageing heat treatment by having a substantial pulse of current passed through it.

The result is a switching device which, as contrasted with the device disclosed in the above mentioned patents, has the significant characteristic that in the absence of an external field it will not automatically switch from the state in which core and shell have the same direction of magnetization (confluent state) to the state where the core and shell have opposite direction of magnetization (reverse state).

Furthermore, the result is a switching device having an asymmetric switching characteristic. That is, the induced pulse when the direction of magnetization of the core switches in a first direction, relative to the shell, is different from the induced pulse when the core switches in a second direction relative to the shell. More specifically, when the device switches from the reverse state to the confluent state the induced pulse is substantially greater than is the pulse induced when switching from the confluent state to the reverse state.

The magnetic switching device thus provided when switching from reverse state to confluent state does so with a large rate of change of flux and thus with a large output pulse from a pick-up coil. The device is relatively insensitive to ambient conditions, including most ambient magnetic fields, and thus is useful in timing, proximity detection and coding applications.

BRIEF DESCRIPTION OF THE DRAWINGS

FIG. 1 represents the magnetization of shell and core in the "reverse" state where shell and core magnetization are in opposite directions.

FIG. 3 is derived from a test using essentially the FIG. 2 arrangement. FIG. 3 illustrates the external drive field, the hysteresis loop and the output pulses obtained.

DESCRIPTION OF THE PREFERRED EMBODIMENTS

The wire described in the referenced patents is used in segments of about one to three cm. When magnetized, each wire segment has two magnetic states. When switching between these two magentic states, at least a portion of the flux switches direction so that a pick-up coil wound around the wire will generate a pulse. The rate at which the flux switches when the wire changes state is so fast that the electrical pulse generated by the pick-up coil is a distinctive, sharp, usable pulse approximately 20 micro-seconds in duration. The switch in state occurs in response to an external magnetic field, having a proper direction, either increasing in magnetic field intensity to above a first threshold or decreasing in magnetic field intensity to below a second threshold. The switching of the wire, thus, is responsive to a threshold magnetic field applied to the wire. As a result, the magnitude of the output pulse is essentially not rate sensitive in that it is only slightly affected by the rate at which the external triggering magnetic field increases or decreases; at least this is the case up to very high rates of field change. The use of this wire for generating this distinctive, high consistent, output pulse has the further advantage that the process occurs without requiring any input electrical signal or current. Thus external permanent magnets can be used as the source of the triggering magnetic field and all that is required is that the position between the bistagle magnetic wire and the external permanent magnets be changed to provide the increase of external field over the first threshold and/or the decrease of external field under the second threshold. Even where the triggering magnetic field is generated by an electric current through a coil around the wire, as in FIG. 2, there is no need for other electrical inputs at the switching device.

It is believed that this bistable magnetic wire operates as it does because of the intimate physical relationship between a magnetically harder shell zone and a magnetically softer core zone. This intimate physical relationship is due to the fact that both shell and core are elements of an otherwise homogeneous wire. The mechanism by which this new phenomenon operates is still being investigated.

Figure 1:
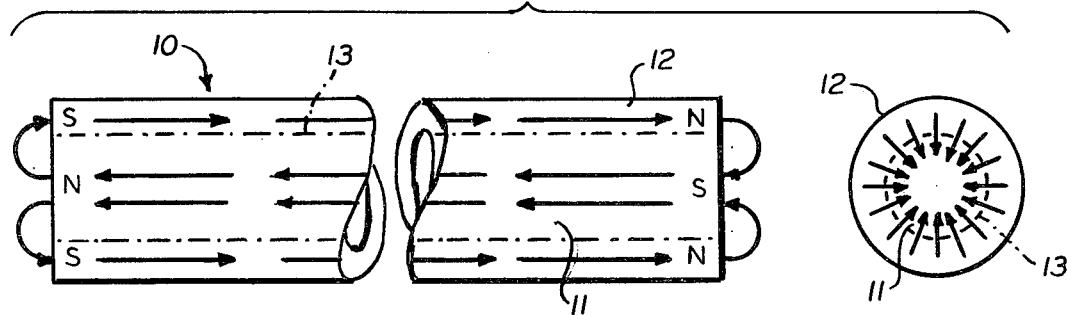
FIG. 1 is an enlarged diagrammatic representation, including a longitudinal view and an end view, of the ferromagnetic wire of this invention, manufactured by the method of the present invention.

With reference to FIG. 1, an embodiment 10 of magnetic wire according to the present invention is shown and comprises a work hardened magnetic material composed of cobalt, iron and vanadium. The magnetic wire segment has a generally circular cross section, preferably a true round cross section or as close to true round as can be reasonably obtained. Wire segments about 0.25 millimeters in diameter and one to three centimeters in length have been found useful.

The wire is processed, as described below, to provide a unitary magnetic wire element 10 having a relatively "soft" core 11 having relatively low magnetic coercivity and relatively "hard" shell 12 having relatively high magnetic coercivity.

The term "coercivity" is used herein in its traditional sense to indicate the magnitude of the external magnetic field necessary to bring the net magnetization of the magnetized sample of ferromagnetic material to zero.

With reference to FIG. 1, the relatively "soft" core 11 is magnetically anisotropic with an easy axis of magnetization substantially parallel to the axis of the wire. The relatively "hard" shell 12 is also magnetically anisotropic with an easy axis of magnetization providing a net magnetization substantially parallel to the axis of the wire. The direction of magnetization of the core 11 is in large part a function of the interaction of the magnetic field of the shell and whatever external magnetic field is applied. In the state shown in FIG. 1, the net magnetization of the core 11 is opposite in direction from the net magnetization of the shell 12. This state is referred to herein as the reverse state. In this reverse state, a domain wall interface 13 defines the boundary between core 11 and shell 12. This interface 13 is shown in FIG. 1 as a cylindrically shaped boundary wall 13, although it is believed that the domain wall interface occurs as a rather complex magnetic transition zone in the wire.

It has been found that pulses may be obtained from wire composed of cobalt, iron and vanadium which are at least one order of magnitude greater than the pulses obtained from the nickel-iron alloy wire disclosed in the above mentioned patents.

A preferred composition for the wire of this invention is one in which the content of cobalt is from about 45 to 55 percent, the content of iron is from about 30 to 50 percent, and the content of vanadium is between about 4 and 14 percent. A commercially available alloy of cobalt, iron and vanadium which has been found suitable for practicing the present invention is available from Wilbur B. Driver Co., Inc., under the trade name Vicalloy. Wire properly processed with a 0.25 millimeter diameter has been used in preparing devices according to the present invention. Vicalloy wire has a composition, nominally, of about 52 percent cobalt, about 10 percent vanadium, and the remainder substantially iron with certain minor constituents including manganese and silicon in amounts slightly under one-half of one percent each.

FIRST TREATMENT SCHEDULE

Figure 5:
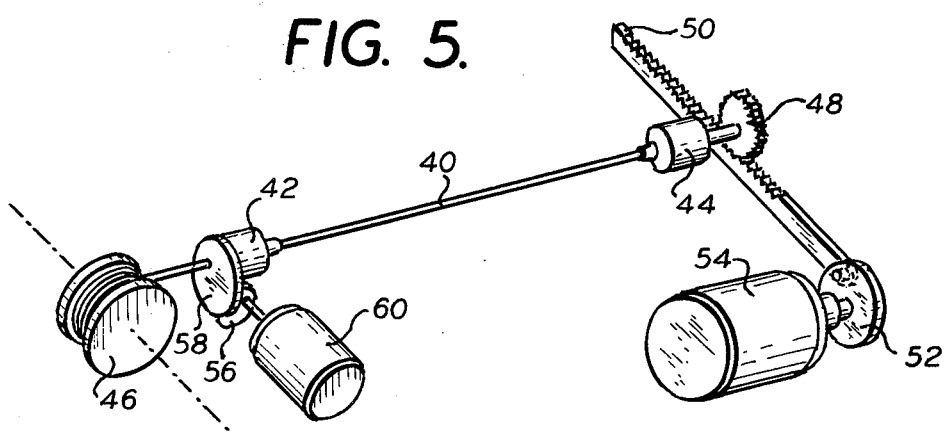
FIG. 5 is a perspective schematic representation of the technique of processing magnetic wire to provide the device of this invention.

Using a 30 centimeter length of this Vicalloy alloy having a diameter of one quarter millimeter (10 mils), a preferred work hardening schedule consists of the following steps:

First. The wire is stretched out to its full length. With reference to FIG. 5, the length of wire 40 is secured in chucks 42 and 44. Enough tension is applied to the wire through a spring loaded reel 46 to hold the wire 40 at its unbent or uncurled length, without elongating the wire. The wire 40 is then subjected to a single cycle of torsional strain comprising approximately 64 counterclockwise turns followed by approximately 48 clockwise turns. The tension is maintained during all torsional straining steps.

Second. The wire is then subjected to seventeen and one-half cycles of eight and one-half turns in each direction. More specifically, 8-½ counterclockwise turns followed by 8-½ clockwise turns are applied and constitute one cycle. The cycle is repeated seventeen times and then this second step is completed with 8-½ counterclockwise turns. During this second step, which normally lasts about 10 to 15 seconds, the 30 centimeter wire is continuously slowly elongated; the amount of elongation being between one percent and two percent.

Third. The final step in the work hardening schedule consists of another series of eight and one-half turns, this time for an even number of cycles, and without further stretching but maintaining tension on the wire. Three to four times the number of cycles used in the second step are employed during this step. About 60 cycles have been found to give good results.

The wire is then cut into usable segments of, for example, 1 to 3 cm. lengths.

The schedule described above for work hardening an iron, cobalt, vanadium alloy wire, has been found to give certain desired results. In determining these desired results, it was also found that variations in the above schedule result in a wire which still exhibits the switching effect.

SECOND TREATMENT SCHEDULE

A less preferred wire treatment schedule that has been found effective with this Vicalloy wire for those applications where maximum time stability is not important is as follows. A 30 centimeter length of one quarter millimeter diameter is used.

First. The wire is stretched out to its full length. The tension applied holds the wire straight at its full length, without elongating the wire. The wire is then subjected to a single cycle torsional strain comprising 14 counterclockwise turns followed by 12 clockwise turns.

Second. The wire is then subjected to 120 cycles of twelve turns in each direction. More specifically, 12 counterclockwise turns followed by 12 clockwise turns are applied and constitute one cycle. This cycle is repeated 120 times. During this second step of the work hardening schedule, the wire is continuously stretched during the torsional straining action. During this second step, the 30 centimeter wire is elongated slowly and continuously by about three millimeters.

Third. The final step in the work hardening schedule consists of another series of twenty cycles of tweleve counterclockwise and twelve clockwise turns without further elongation but maintaining tension on the wire so that the elongation imposed in step two is maintained.

The wire is then cut into desired lengths of, for example, 1 to 3 centimeters.

The alloy used in both work hardening schedules is essentially the same. It is initially annealed to assure a uniform starting material and to assure adequate ductility for the work hardening shcedule. The wire is preferably initially annealed to the point where the grain structure is approximately 10,000 grains (or more) per square millimeter. This fine grain structure aids in assuring the required ductility.

A fourth step has been found important in connection with both of the schedules mentioned above. This fourth step is a heat treatment step. During the early stages of experimentation, this heat treatment was at approximately 320° C. for approximately eight hours. However, it was found satisfactory to run the heat treatment step for four hours at approximately 300° C. and such had the benefit of speeding up the processing of the wire. It is presently preferred to perform the heat treatment step by sending a 5.6 ampere current through this 0.25 mm wire for 120 milli-seconds. The heat treatment produces a discernable improvement in the output pulse. Perhaps more importantly, this heat treatment reduces the risk that the characteristics of the wire will change in use as a wire is subjected to a high temperature environment. This fourth step of post-work-hardening heat treatment provides an ageing which results in stability in use.

WIRE TESTING PROCEDURES AND RESULTS

Figure 2:
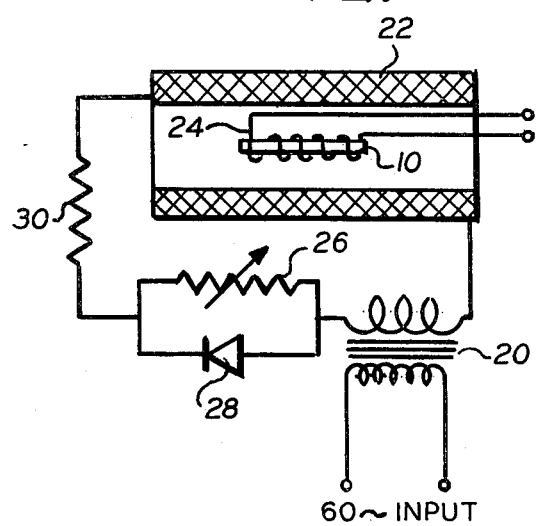
FIG. 2 is a schemtic representation of a solenoid drive used to apply an external field to the magnetic wire of FIG. 1 and of a pick-up coil used to provide an output pulse in response to the switch in magnetic state of the wire.

FIG. 2 schematically illustrates a test apparatus used to determine the output pulses that may be obtained by using the vanadium-cobalt-iron wire of this invention and to compare it with the nickel-iron wire described in the above mentioned patents. A 60 Herz line input is applied to a transformer 20 to provide an alternating signal to a solenoid 22. A segment of the wire 10 is centrally positioned within the solenoid 22 and a pickup coil 24 is wound around the wire 10. Current through the winding of the solenoid 22 produces an axial magnetic field within the center of the solenoid 22.

It has been found that the most pronounced output pulses from the vanadium-cobalt-iron wire are obtained when the wire is switched asymmetrically. As a result of the FIG. 2 circuitry, the exciting field H applied to the wire 10 is represented by the curve 32 in FIG. 3. The diode 28 lets through the full positive half cycle of the alternating sixty Herz signal and the resistor 26 is adjusted to let through a much reduced negative half cycle so that the exciting field applied to the wire 10 has a positive peak of 150 Oersteds and a negative peak of only about 20 Oersteds. The resistor 30 is simply a current limiting resistor.

Figure 3:
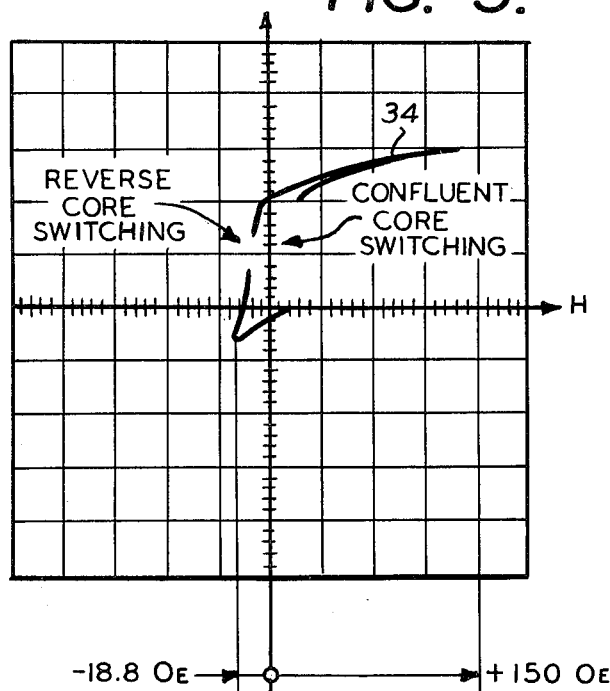
FIG. 3 is a graphical representation of the asymmetric switching mode for switching the state of the wire.
Figure 3:
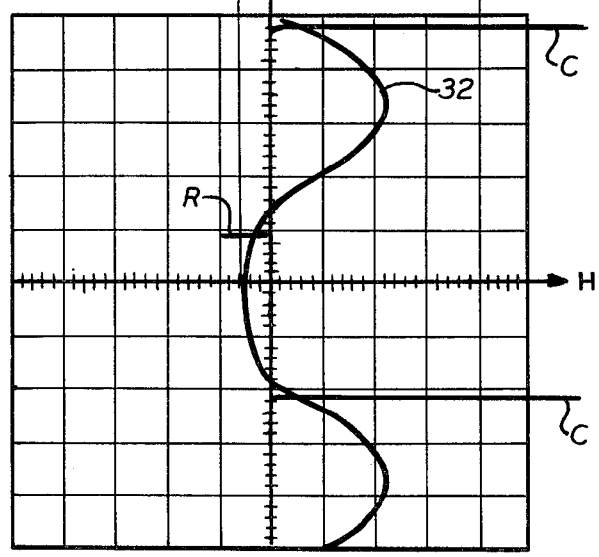

The hysteresis loop for the wire 10 of this invention, when so excited, is shown by the curve 34 in FIG. 3. FIG. 3 is illustrated in substantially the form it would appear on an oscilliscope. The breaks (Wiegand jumps)

in the curve 34 that are labelled "Reverse Core Switching" and "Confluent Core Switching" appear on the oscilliscope as only a faint trace because the rate of change of flux (or magnetization B) through the core 10 is very rapid as the strength of the external field H passes through the corresponding threshold value. The larger gap in the curve 34 is labelled Confluent Core Switching. This condition occurs when the external applied longitudinal magnetic field H switches longitudinal magnetization of the core from the reverse state (shown in FIG. 1) where the core magnetization is opposite in direction to the magnetization of the shell 12 to the confluent state where the core magnetization is in the same direction as the magnetization of the shell. During Reverse Core Switching, the core is switched by the magnetic field H from the confluent state into the reverse state. As indicated in FIG. 3, the pulse C induced in the coil 24 when switching from reverse state to confluent state is much greater than the pulse R induced when switching from confluent state to reverse state. The confluent core switching induced pulse C has about ten times the amplitude of the reverse core switching induced pulse R.

More specifically, using a 3 cm. length of wire 10 and pick-up coil 24 with 925 turns of No. 38 wire and where the output of the coil 24 is fed to a 1000 ohm load, the pulse C is greater than the 1.5 volts and has a width of approximately 20 microseconds at half amplitude. The R pulse, by contrast, has comparable values of 125 millivolts and a width of at least 60 microseconds. Thus, under these conditions, the C pulse has twelve times the amplitude of the R pulse. Into an open circuit, a C pulse of more than two volts has been obtained.

Figure 4:
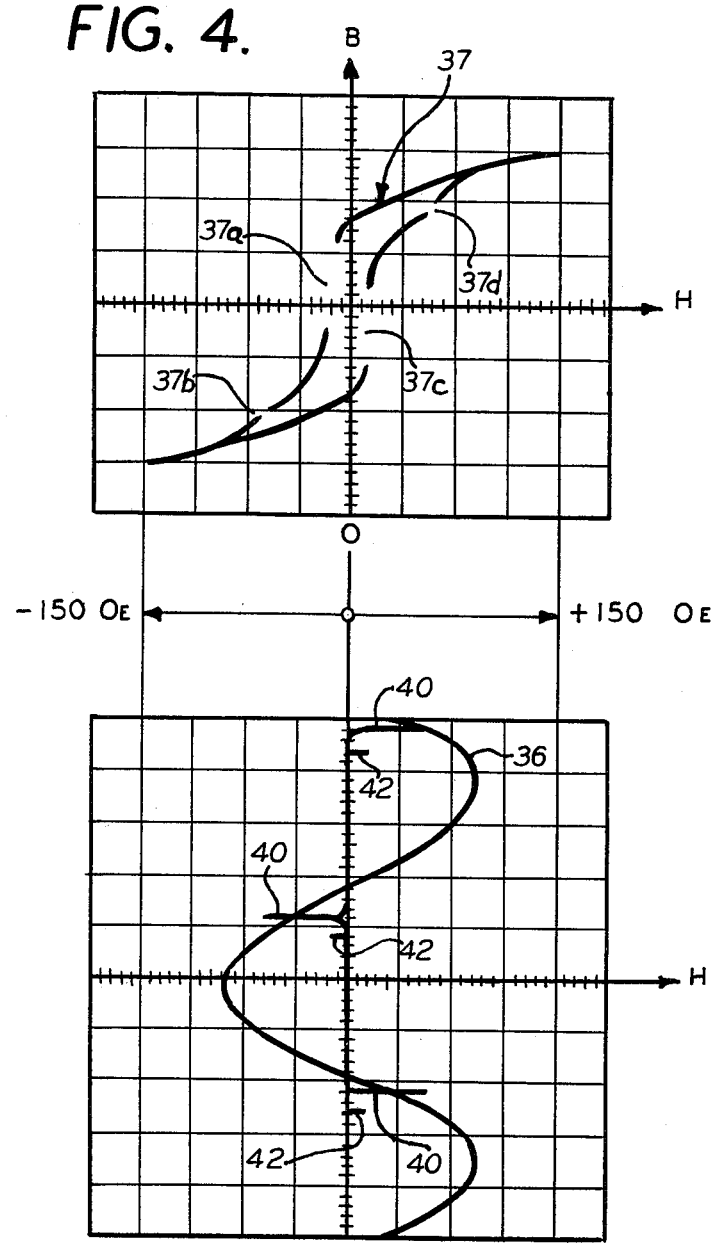
FIG. 4 is a graphical representation of the symmetric switching mode for switching the state of the wire illustrating external drive field, hysteresis loop and output pulses.

Interestingly enough, when the drive provides a negative field H of 150 Oersteds as well as a positive field H of 150 Oersteds, two pulses 40 are produced which are equal to one another and opposite in polarity (see FIG. 4). In the specific embodiment described above, these two pulses 40 each have an amplitude of about 550 millivolts and a width of about 40 microseconds at half amplitude.

Thus, when the switching is symmetric, the two core switching pulses produced are equal to one another and are substantially less in magnitude than is the confluent core switching pulse C obtained by the optimum asymmetric switching and substantially greater in magnitude than is the reverse core switching pulse R obtained in the optimum asymmetric drive. This situation is illustrated in FIG. 4. Employing exactly the same configuration as described above in FIG. 2 except that the diode 28 and resistor 26 are omitted, a full sinusiodal exciting field 36 is applied to the wire 10 to provide an external field H having a strength that cycles from plus 150 Oersteds to minus 150 Oersteds. The result is the hysteresis curve 37.

At the full positive field H, both shell 12 and core 11 are magnetized in the positive direction, represented by the upper right hand corner of the hysteresis curve 37. This can be considered a positive confluent state. As the external field H decreases, the magnetization B will decrease until at a relatively small negative field H of about minus 12 Oersteds, the core 11 switches its direction of magnetization from positive to negative. Thus the device 10 switches from a confluent state to a reverse state. This produces a break 37a in the curve 37 and results in an output pulse from the pickup coil 24 of approximately 550 millivolts with a 40 microsecond width. As the magnetization H continues to increase in a negative direction, a point is reached where the direction of magnetization of the shell switches producing a small break 37B in the hysteresis curve 37 and a small output pulse 42. The core and shell are now in a negative confluent state. The field H goes to a negative peak and then comes back becoming less negative. When the field H becomes slightly positive (about 12 Oersteds) the core 12 switches direction into a positive direction, represented by the break 37c. This produces another output pulse 40 which is 550 millivolts in amplitude and 40 microseconds wide. This is a switch from the negative confluent state to a reverse state. The field H continues further positive until a point is reached, represented by the small break 37d, where the shell switches its direction of magnetization producing a small output pulse 42 and returning the device 10 to its positive confluent state.

When the applied excitation H goes sufficiently negative as well as sufficiently positive to switch the shell, as in FIG. 4, the switching of the core always occurs when the device is switching from its confluent state to its reverse state. By contrast, when the excitation H is limited in one direction so that the direction of shell magnetization does not switch, as in FIG. 3, then there is an asymmetric switching in that there is a reverse core switch where the device switches from its confluent state to its reverse state and a confluent core switch where the device switches from its reverse state to its confluent state. The switching from a reverse state to a confluent state provides a greater output pulse than does the switching from a confluent state to a reverse state because the former occurs at a faster rate than does the latter.

In the embodiments described above, it is necessary for the exciting field H to reverse its direction in order to switch the direction of magnetization of the core. Merely removing the drive field H entirely will not result in reversal of core 11 magnetization. This necessity for reversing the drive field in order to switch core magnetization is true whether the switching mode is asymmetric as illustrated in connection with FIG. 3 or symmetric as illustrated in connection with FIG. 4.

By contrast, the nickel-iron wire embodiments disclosed in the above mentioned patent automatically switches from a confluent state to a reverse state upon removal of the excitation field. Furthermore, by contrast with the iron-nickel wire disclosed in the above patents, the maximum output pulse obtainable with the use of the iron-cobalt-vanadium wire of this invention is approximately ten times as great as can be obtained with the nickel-iron wire disclosed in the above mentioned patents, under similar conditions of loading and with the same pick-up coil 24.

FIG. 5 is a mechanical schematic to represent one mechanism used in cold working the wire. A length of wire 40, for example 30 cm, is pulled off a spring loaded reel 46. Tension is thereby held on the wire 40 to keep it straight. The wire 40 is fed through chuck 42 to chuck 44. The chucks 42, 44 are then tightened to hold the wire in place. Cyclical torsional straining of the wire 40 is then effected by alternate rotation of the pinion 48 on the rack 50. The rack 50 moves back and forth because it is eccentrically mounted on the plate 52 which is driven by the motor 54. Elongation of the wire 40 is effected by slow rotation of the cam 56 which bears against the ear 58 on the chuck 42. The cam 56 is rotated by motor drive 60.

Although, in the embodiments described a particular wire length and diameter is disclosed, there is nothing inherent in the invention that would limit the wire to those particular lengths or diameters. There is a wide range of wire segment lengths and diameters which can be employed as the switching device of this invention and the limits of that range have not yet been determined. However, it is presently believed that the ability to obtain the switching effect shown in FIG. 3 may require an as yet undetermined minimum length for the wire segment 10. Specifically, in order for the magnetism of the core to be maintained when in the confluent state, in the absence of an external magnetic field H, the wire segment 10 may have to be greater than a predetermined length. It is believed that if the switching from a confluent state to a reverse state is automatic upon removal of the external filed H, then the magnitude of the confluent core switching pulse C (when switching from reverse state to confluent state) will not be as large in amplitude.

What is claimed is:

1. A unitary magnetic device having first and second magnetic portions, both of said magnetic portions being capable of retaining net magnetization after being subjected to a magnetic field, the net coercivity of said first portion being substantially greater than the net coercivity of said second portion, said first and second portions having substantially the same chemical alloy composition, said device having a reverse state wherein said first and said second portions have the opposite direction of magnetization and a confluent state wherein said first and said second portions have the same direction of magnetization, said first and second portions being separated solely by a magnetic interface when in said reverse state, said second portion having a coercivity sufficiently great so that when said device is in said confluent state, the magnetization of said first portion is inadequate to switch said device into said reverse state.

2. The device of claim 1 wherein: when said device is in said confluent state, an external field is required to switch said device to said reverse state.

3. The device of claims 1 wherein: the switching of said device from said reverse state to said confluent state occurs substantially faster than does the switching of said device from said confluent state to said reverse state.

4. The device of claim 3 wherein: when said device is in said confluent state, an external field is required to switch said device to said reverse state.

5. The device of claim 1, 2, 3 or 4 wherein: said chemical alloy composition has a substantial percentage by weight of iron, a substantial percentage by weight of cobalt, and a substantial percentage by weight of vanadium, said iron and said cobalt in combination constituting over 80% by weight of said alloy.

6. The device of claim 1, 2, 3 or 4 wherein: said alloy composition is between 45% and 55% cobalt, between 30% and 50% iron and between 4% and 14% vanadium.

7. The device of claim 1, 2, 3 or 4 wherein: said alloy composition is approximately 52% cobalt, 10% vanadium, and the rest substantially iron.

8. A unitary magnetic wire device having shell and core magnetic portions, both of said magnetic portions being capable of retaining net magnetism after being subjected to a magnetic field, the net coercivity of said shell portion being substantially greater than the net coercivity of said core portion, said shell and core portions having substantially the same chemical alloy composition, said device having a reverse state wherein said shell and said core portions have the opposite direction of magnetization and a confluent state wherein said shell and said core portions have the same direction of magnetization, said shell and core portions being separated solely by a magnetic interface when in said reverse state, said core portion having a coercivity sufficiently great so that when said device is in said confluent state, the magnetization of said shell portion in inadequate to switch said device into said reverse state.

9. The device of claim 8 wherein: when said device is in said confluent state, an external field is required to switch said device to said reverse state.

10. The device of claims 8 wherein: the switching of said device from said reverse state to said confluent state occurs substantially faster than does the switching of said device from said confluent state to said reverse state.

11. The device of claim 10 wherein: when said device is in said confluent state, an external field is required to switch said device to said reverse state.

12. The device of claim 8, 9, 10 or 11 wherein: said chemical alloy composition has a substantial percentage by weight of iron, a substantial percentage by weight of cobalt, and a substantial percentage by weight of vanadium, said iron and said cobalt in combination constituting over 80% by weight of said alloy.

13. The device of claim 8, 9, 10 or 11 wherein: said alloy composition is between 45% and 55% cobalt, between 30% and 50% iron and between 4% and 14% vanadium.

14. The device of claim 8, 9, 10 or 11 wherein: said alloy composition is approximately 52% cobalt, 10% vanadium and the rest substantially iron.

15. A unitary magnetic wire device having a substantially uniform chemical composition comprising: an alloy of vanadium, cobalt and iron in amounts to provide, as a result of cyclical torsional cold working and subsequent heat treatment, shell and core magnetic portions, said shell and core portions being capable of retaining net magnetization after being subjected to a magnetic field, the net coercivity of said shell portion being substantially greater than the net coercivity of said core portion, said device having a reverse state wherein said shell and said core portions have the opposite direction of magnetization and a confluent state wherein said shell and said core portions have the same direction of magnetization, said shell and core portions being separated solely by a magnetic interface when in said reverse state, said core portion having a coercivity sufficiently great so that when said device is in said confluent state, the magnetization of said shell portion is inadequate to switch said device into said reverse state, an external field being required to switch said device to said reverse state.

16. The device of claim 15 wherein: the switching of said device from said reverse state to said confluent state occurs substantially faster than does the switching of said device from said confluent state to said reverse state.

17. The device of claim 15 or 16 wherein: said chemical alloy composition has a substantial percentage by weight of iron, a substantial percentage by weight of cobalt, and a substantial percentage by weight of vanadium, said iron and said cobalt in combination consistuting over 80% by weight of said alloy.

18. The device of claim 15 or 16 wherein: said alloy composition is between 45% and 55% cobalt, between 30% and 50% iron and between 4% and 14% vanadium.

19. The device of claim 15 or 16 wherein: said alloy composition is approximately 52% cobalt, 10% vanadium and the rest substantially iron.

* * * * *